United States Patent

Sumita et al.

(10) Patent No.: US 6,376,923 B1
(45) Date of Patent: Apr. 23, 2002

(54) FLIP-CHIP TYPE SEMICONDUCTOR DEVICE SEALING MATERIAL AND FLIP-CHIP TYPE SEMICONDUCTOR DEVICE

(75) Inventors: Kazuaki Sumita; Kimitaka Kumagae; Miyuki Wakao; Toshio Shiobara, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/589,279

(22) Filed: Jun. 8, 2000

(30) Foreign Application Priority Data

Jun. 8, 1999 (JP) .............................. 11-160671

(51) Int. Cl.⁷ .............................................. H01L 23/29
(52) U.S. Cl. ...................... 257/791; 257/778; 257/783; 257/789; 257/795
(58) Field of Search ................. 257/778, 782, 257/783, 788, 789, 791, 795

(56) References Cited

U.S. PATENT DOCUMENTS

| 4,877,822 A | | 10/1989 | Itoh et al. ............... 523/433 |
| 4,902,732 A | | 2/1990 | Itoh et al. ............... 525/433 |
| 4,985,751 A | * | 1/1991 | Shiobara et al. .......... 257/669 |
| 4,999,699 A | | 3/1991 | Christie et al. .......... 257/778 |
| 5,053,445 A | | 10/1991 | Itoh et al. ............... 523/435 |
| 5,089,440 A | | 2/1992 | Christie et al. .......... 29/841 |
| 5,248,710 A | * | 9/1993 | Shiobara et al. .......... 523/435 |
| 5,292,688 A | | 3/1994 | Hsiao et al. ............. 29/840 |
| 5,300,588 A | * | 4/1994 | Shiobara et al. .......... 525/422 |
| 5,362,775 A | * | 11/1994 | Shintai et al. ........... 523/451 |
| 5,827,908 A | * | 10/1998 | Arai et al. .............. 523/212 |
| 5,928,595 A | | 7/1999 | Knapp et al. ............ 264/272.17 |
| 5,940,688 A | * | 8/1999 | Higuchi et al. .......... 438/127 |
| 6,001,901 A | * | 12/1999 | Shiobara et al. .......... 523/443 |
| 6,083,774 A | * | 7/2000 | Shiobara et al. .......... 438/108 |
| 6,084,037 A | * | 7/2000 | Shimizu et al. .......... 525/476 |
| 6,221,509 B1 | * | 4/2001 | Hirano et al. ........... 428/620 |
| 6,225,704 B1 | * | 5/2001 | Sumita et al. ........... 257/789 |

FOREIGN PATENT DOCUMENTS

| JP | 58-103525 | * | 6/1983 |
| JP | B2-6148554 | | 10/1986 |
| JP | B2-6360069 | | 11/1988 |
| JP | 10-53641 | * | 2/1998 |

* cited by examiner

Primary Examiner—Olik Chaudhuri
Assistant Examiner—Alonzo Chambliss
(74) Attorney, Agent, or Firm—Birch, Stewart, Kolasch & Birch, LLP

(57) ABSTRACT

A sealing material comprising (A) a liquid epoxy resin, (B) a curing agent, (C) a copolymer obtained through addition reaction between an alkenyl group-containing epoxy resin and an SiH group-containing organopolysiloxane, (D) an inorganic filler having a specific surface area of less than 4 $m^2/g$, and (E) a fine inorganic filler having a specific surface area of at least 4 $m^2/g$ and surface treated with an aminosilane or organosilazane compound is suitable for sealing flip-chip type semiconductor devices. Despite high loading of inorganic fillers, the material has a low viscosity in the low shear region and improved thin-film infiltration and forms a reliable seal.

17 Claims, 1 Drawing Sheet

FLIP-CHIP TYPE SEMICONDUCTOR DEVICE SEALING MATERIAL AND FLIP-CHIP TYPE SEMICONDUCTOR DEVICE

This invention relates to a flip-chip type semiconductor device sealing material and a flip-chip type semiconductor device encapsulated therewith.

BACKGROUND OF THE INVENTION

With the advance of electric equipment toward smaller size, lighter weight and higher performance, the semiconductor mounting technology has changed from the pin mating type to the surface mounting which now becomes the mainstream. One bare chip mounting technology is flip-chip (FC) mounting. The flip-chip mounting is a technique of providing an LSI chip on its circuit pattern-bearing surface with several to several thousands of electrodes, known as bumps, of about 10 to 100 microns high and joining the chip to electrodes on a substrate with a conductive paste or solder. Then the sealing material used for the protection of FC devices must penetrate into gaps of several tens of microns defined by bumps between the substrate and the LSI chip. Conventional liquid epoxy resin compositions used as the underfill material for flip-chip devices are generally composed of a liquid epoxy resin, a curing agent and an inorganic filler. Of these, the most predominant is a composition in which a large amount of inorganic filler is blended in order to provide a matching coefficient of linear expansion with those of semiconductor chips, substrates and bumps for increased reliability.

With respect to stress properties, the flip-chip underfill materials with high loading of filler give rise to no problem. However, they suffer from very low productivity since they have a high viscosity and high thixotropy due to the high filler loading so that they may penetrate into the gap between chip and substrate at a very slow rate. There is a desire to overcome this problem.

It is a common practice in the art to treat the fillers with surface modifiers such as silane coupling agents for improving the affinity of the filler surface to epoxy resins and hence, the bond strength therebetween. Although no problems arise with limited amounts of fillers, materials loaded with large amounts of fillers cannot be fully improved in performance simply by surface treating the fillers with modifiers or adding surface modifiers.

SUMMARY OF THE INVENTION

An object of the invention is to provide a flip-chip type semiconductor device sealing material which maintains a low enough viscosity to ensure interstitial infiltration even when filled with a large amount of inorganic filler and which cures to form a reliable seal. Another object is to provide a flip-chip type semiconductor device encapsulated with the sealing material and having improved reliability.

The invention is based on the following discovery. In an epoxy resin composition comprising (A) 100 parts by weight of a liquid epoxy resin and (B) 0 to 80 parts by weight of a curing agent, there is blended a copolymer obtained through addition reaction between an alkenyl group-containing epoxy resin and an organopolysiloxane represented by the average compositional formula (1) to be defined below, the addition reaction taking place between alkenyl groups in the epoxy resin and hydrogen atoms attached to silicon atoms (i.e., SiH groups) in the organopolysiloxane, the organopolysiloxane units in the copolymer being 1 to 15 parts by weight per 100 parts by weight of components (A) and (B) combined. Further blended in the composition is a mixture of coarse and fine inorganic fillers having a specific surface area of less than 4 m$^2$/g and at least 4 m$^2$/g, respectively, as measured by the BET method. The fine inorganic filler having a specific surface area of at least 4 m$^2$/g has been surface treated with an aminosilane or organosilazane compound represented by the general formula (2) or (3) to be defined below. The amount of the inorganic filler mixture is 100 to 400 parts by weight per 100 parts by weight of components (A), (B) and (C) combined, and preferably the fine inorganic filler having a specific surface area of at least 4 m$^2$/g accounts for 5 to 30% by weight of the inorganic filler mixture. The resulting epoxy resin composition maintains a low enough viscosity to ensure interstitial infiltration even when filled with a large amount of inorganic fillers and is thus suitable as a sealing material for flip-chip type semiconductor devices. Flip-chip type semiconductor devices encapsulated with the sealing material remain highly reliable.

Accordingly, the invention provides a sealing material for flip-chip type semiconductor devices comprising (A) 100 parts by weight of a liquid epoxy resin,
(B) 0 to 80 parts by weight of a curing agent,
(C) a copolymer obtained through addition reaction between an epoxy resin having alkenyl groups and an organopolysiloxane represented by the following average compositional formula (1):

$$H_a R_b SiO_{(4-a-b)/2} \qquad (1)$$

wherein R is a substituted or unsubstituted monovalent hydrocarbon group, a is a positive number of 0.005 to 0.2, b is a positive number of 1.8 to 2.2, and the sum of a and b is from 1.805 to 2.3, the addition reaction taking place between alkenyl groups in the epoxy resin and hydrogen atoms attached to silicon atoms in the organopolysiloxane, the organopolysiloxane units in the copolymer being 1 to 15 parts by weight per 100 parts by weight of components (A) and (B) combined, (D) 50 to 350 parts by weight of an inorganic filler having a specific surface area of less than 4 m$^2$/g, and ( E) 5 to 120 parts by weight of a fine inorganic filler having a specific surface area of at least 4 m$^2$/g and surface treated with an aminosilane or organosilazane compound represented by the following general formula (2) or (3):

$$(R^1)_3SiN(R^2)_2 \qquad (2)$$

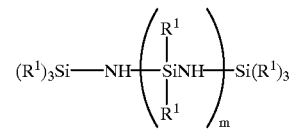

$$(3)$$

wherein R$^1$ is independently selected from an alkyl group of 1 to 4 carbon atoms, vinyl group and phenyl group, R$^2$ is hydrogen or as defined for R$^1$, and m is an integer of 0 to 4, the total amount of inorganic fillers (D) and (E) being 100 to 400 parts by weight per 100 parts by weight of components (A), (B) and (C) combined.

Also contemplated herein is a flip-chip type semiconductor device sealed with the sealing material in a cured state.

DESCRIPTION OF THE PREFERRED EMBODIMENTS

Figure 1:
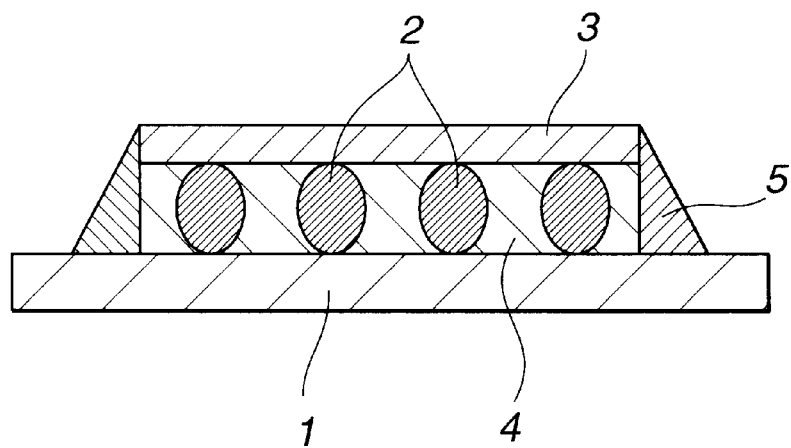
FIG. 1 is a schematic cross-sectional view of a flip-chip type semiconductor device according to one embodiment of the invention.

In the flip-chip type semiconductor device sealing material or epoxy resin composition according to the invention, the liquid epoxy resin used as component (A) may be any epoxy resin as long as it has at least two epoxy groups in a molecule. Preferred examples include bisphenol type epoxy resins such as bisphenol A type epoxy resins and bisphenol F type epoxy resins, novolac type epoxy resins such as phenol novolac type epoxy resins and cresol novolac type epoxy resins, naphthalene type epoxy resins, biphenyl type epoxy resins, and cyclopentadiene type epoxy resins. Of these, epoxy resins which are liquid at room temperature (25° C.) are used. Any of epoxy resins of the following structure may be added to the foregoing epoxy resins in such an amount as not to adversely affect the interstitial infiltration thereof.

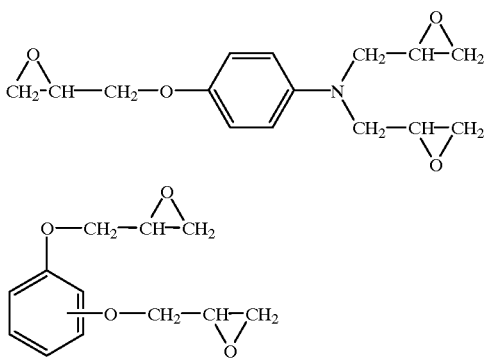

The liquid epoxy resins preferably have a total chlorine content of up to 1,500 ppm, and especially up to 1,000 ppm. When chlorine is extracted from the epoxy resin with water at an epoxy resin concentration of 50% and a temperature of 100° C. over a period of 20 hours, the water-extracted chlorine content is preferably up to 10 ppm. At a total chlorine content of greater than 1,500 ppm or a water-extracted chlorine level of more than 10 ppm, the semiconductor device would become less reliable, especially in the presence of moisture.

The above-described epoxy resin can be cured with the curing accelerator to be described later as component (F) alone when it is a self-polymerizable epoxy resin. A curing agent as component (B) is used as the case may be. Typical curing agents include acid anhydrides of about 4 to 25 carbon atoms, preferably about 8 to 20 carbon atoms, preferably containing one or two aliphatic or aromatic rings and one or two acid anhydride groups in a molecule, such as tetrahydrophthalic anhydride, methyltetrahydrophthalic anhydride, methylhexahydrophthalic anhydride, hexahydrophthalic anhydride, methylhymic anhydride, pyromellitic acid dianhydride, benzophenonetetracarboxylic acid dianhydride, 3,3'4,4'-biphenyltetracarboxylic acid dianhydride, bis(3,4-dicarboxyphenyl)ether dianhydride, bis(3,4-dicarboxyphenyl)methane dianhydride, and 2,2-bis(3,4-dicarboxyphenyl)propane dianhydride; and carboxylic acid hydrazides such as dicyandiamide, adipic acid hydrazide and isophthalic acid hydrazide.

The curing agent (B) is blended in an amount of 0 to 80 parts by weight per 100 parts by weight of the epoxy resin (A). Where an acid anhydride is used as the curing agent, it is preferably blended so as to give 0.3 to 0.7 mol of acid anhydride groups

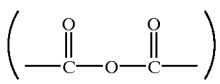

per mol of epoxy groups in the epoxy resin. Less than 0.3 mol of acid anhydride groups would provide insufficient curability whereas an amount giving more than 0.7 mol of acid anhydride groups would leave part of the acid anhydride unreacted, which leads to a drop of glass transition temperature. It is more desirable that 0.4 to 0.6 mol of acid anhydride groups be available per mol of epoxy groups in the epoxy resin.

Whether or not the curing agent is used, the curing accelerator as component (F) is preferably used in the composition. Any of well-known curing accelerators may be used. Illustratively, one or more curing accelerators selected from imidazole derivatives, tertiary amine compounds, and organic phosphorus compounds may be blended. Exemplary imidazole derivatives are 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole. Exemplary tertiary amine compounds are amine compounds having alkyl or aralkyl groups as the substituent attached to the nitrogen atom such as triethylamine, benzyltrimethylamine, and α-methylbenzyldimethylamine; cycloamidine compounds and salts thereof with organic acids such as 1,8-diazabicyclo-[5.4.0]undecene-7 and the phenol salt, octylic acid salt, and oleic acid salt thereof; salts or complex salts of cycloamidine compounds with quaternary boron compounds such as the compound represented by the following formula.

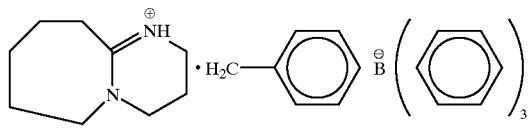

Exemplary organic phosphorus compounds are triorganophosphine compounds such as triphenylphosphine, and quaternary phosphonium salts such as tetraphenylphosphonium tetraphenyl borate.

An appropriate amount of the curing accelerator blended is 0 to 10 parts, usually 0.01 to 10 parts, desirably 0.5 to 5 parts by weight per 100 parts by weight of the epoxy resin.

Less than 0.01 part of the curing accelerator may not be effective for accelerating cure whereas more than 10 parts is effective for accelerating cure, but tends to detract from storage stability.

Component (C) is a copolymer obtained through addition reaction between an alkenyl group-containing epoxy resin and an organopolysiloxane or organohydrogenpolysiloxane represented by the following average compositional formula (1):

$$H_aR_bSiO_{(4-a-b)/2} \quad (1)$$

wherein R is a substituted or unsubstituted monovalent hydrocarbon group, a is a positive number of 0.005 to 0.2, b is a positive number of 1.8 to 2.2, and the sum of a and b is from 1.805 to 2.3, preferably a is a positive number of 0.01 to 0.1, b is a positive number of 1.9 to 2.0, and the sum of a and b is from 1.91 to 2.1. The addition reaction takes place between alkenyl groups in the epoxy resin and hydrogen atoms attached to silicon atoms (i.e., SiH groups) in the organopolysiloxane.

A variety of epoxy resins are useful as the alkenyl group-containing epoxy resin which is one reactant of the copolymer as long as the epoxy resin has at least one, preferably at least two epoxy groups (e.g., glycidyloxy) attached to an aromatic ring in a molecule and at least one, preferably at least two alkenyl groups. Exemplary are alkenyl group-containing epoxy resins of the following formulae (4) to (6).

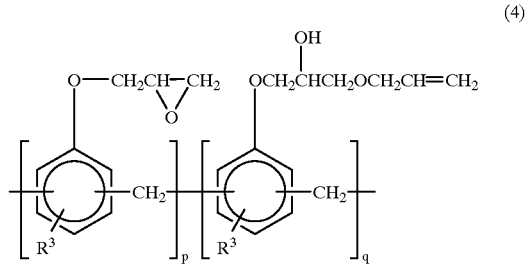

(4)

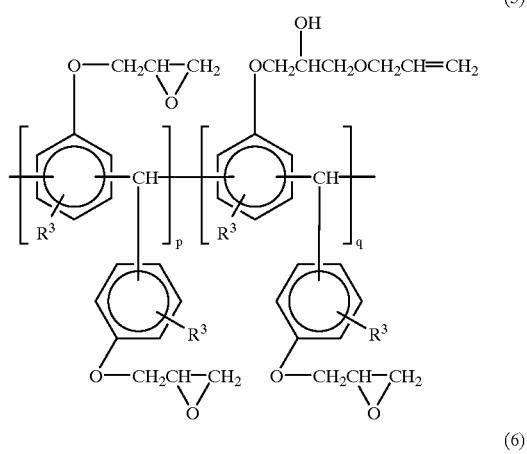

(5)

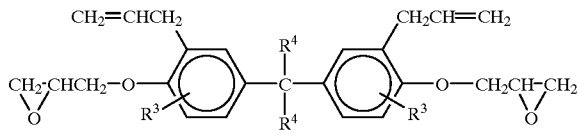

(6)

In the formulae, $R^3$ is hydrogen, methyl or bromine, $R^4$ is hydrogen, methyl or trifluoromethyl, p and q are natural numbers, preferably p+q is an integer of 2 to 50, and more preferably 2 to 20.

On the other hand, the organopolysiloxane of formula (1) preferably has in a molecule about 10 to 400 silicon atoms, more preferably about 20 to 400 silicon atoms, and especially about 40 to 200 silicon atoms, and preferably 1 to 5 SiH groups, more preferably 2 to 4 SiH groups, most preferably 2 SiH group. The monovalent hydrocarbon groups represented by R are preferably those of 1 to 10 carbon atoms, especially 1 to 8 carbon atoms, and also preferably free of aliphatic unsaturation, for example, alkyl groups such as methyl, ethyl, propyl, isopropyl, butyl, isobutyl, tert-butyl, hexyl, cyclohexyl, octyl, and decyl; alkenyl groups such as vinyl, allyl, propenyl, butenyl, and hexenyl; aryl groups such as phenyl, xylyl and tolyl; and aralkyl groups such as benzyl, phenylethyl and phenylpropyl. Also included are halogen-substituted monovalent hydrocarbon groups wherein some or all of the hydrogen atoms in the foregoing hydrocarbon groups are replaced by halogen atoms such as chlorine, fluorine and bromine, for example, chloromethyl, bromoethyl and trifluoropropyl.

Examples of the organohydrogenpolysiloxane include both end trimethylsiloxy-blocked methylhydrogenpolysiloxane, both end trimethylsiloxy-blocked dimethylsiloxane-methylhydrogensiloxane copolymers, both end dimethylhydrogensiloxy-blocked dimethylpolysiloxane, both end dimethylhydrogensiloxy-blocked dimethylsiloxane-methylhydrogensiloxane copolymers, both end dimethylhydrogensiloxy-blocked dimethylsiloxane-diphenylsiloxane copolymers, both end dimethylhydrogensiloxy-blocked dimethylsiloxane-methylphenylsiloxane copolymers. Although these exemplary siloxanes are of basically straight-chain structure, they may partially contain a branched siloxane structure.

The organopolysiloxane desirably has a molecular weight of about 700 to 50,000 though not critical. When a copolymer obtained from an organopolysiloxane having a molecular weight of about 700 to 50,000 is blended in the epoxy resin composition, the copolymer is incompatible with the matrix and forms a fine island-in-sea structure. With a molecular weight of less than 700, the copolymer is compatible with the matrix so that the island-in-sea structure may disappear. With a molecular weight of more than 50,000, the island-in-sea structure becomes larger. In either case, the advantages of low viscosity and thin-film infiltration can be degraded.

In preparing a copolymer by reacting the alkenyl group-containing epoxy resin with the organohydrogenpolysiloxane, well-known addition reaction can be employed to effect hydrosilylation reaction between alkenyl groups in the epoxy resin and hydrogen atoms attached to silicon atoms (i.e., SiH groups) in the organohydrogenpolysiloxane.

As the block copolymer mentioned above, use may be made of the known copolymers disclosed in JP-B 61-48544 corresponding to U.S. Pat. No. 4,902,732 and JP-B 63-60069 corresponding to U.S. Pat. Nos. 4,877,822 and 5,053,455. Typical examples are given below.

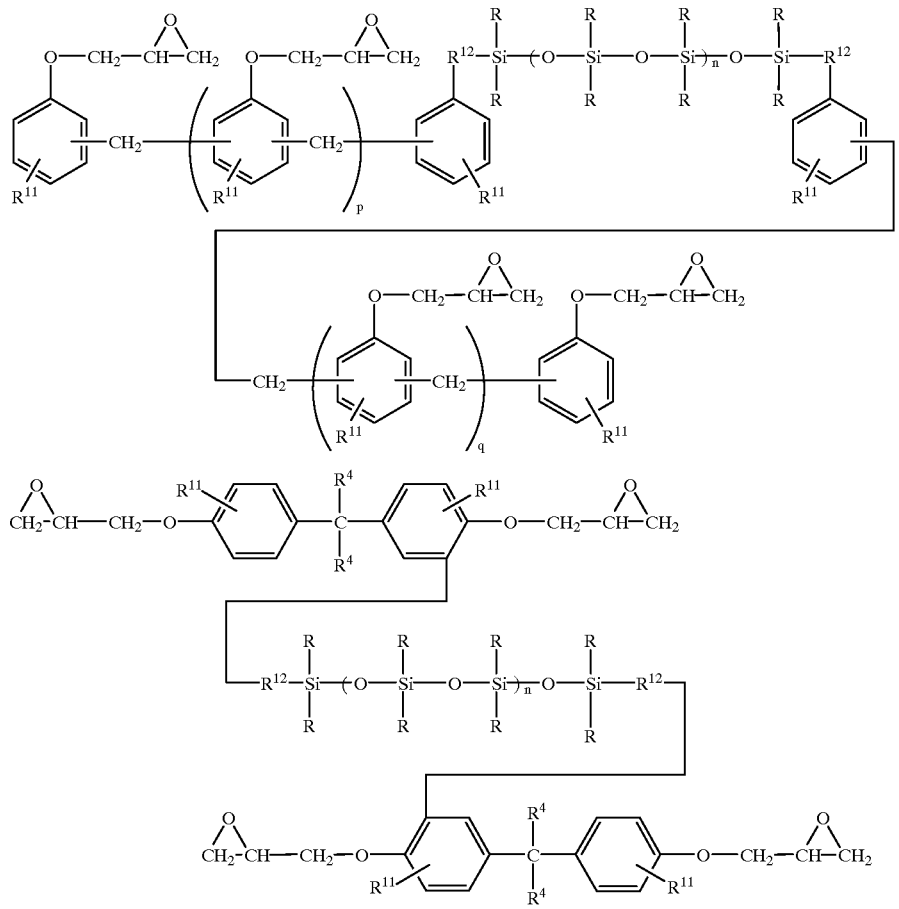

Herein, R and $R^4$ are as defined above, $R^{11}$ is hydrogen or alkyl of 1 to 4 carbon atoms, $R^{12}$ is $-CH_2CH_2CH_2-$, $-OCH_2-CH(OH)-CH_2-O-CH_2CH_2CH_2-$ or $-O-CH_2CH_2CH_2-$, letter n is an integer of 4 to 199, preferably 19 to 99, p is an integer of 1 to 10, and q is an integer of 1 to 10.

The copolymer is blended in such amounts that 1 to 15 parts, and preferably 2 to 10 parts by weight of the organopolysiloxane units may be available per 100 parts by weight of the liquid epoxy resin (A) and curing agent (B) combined. Less than 1 part of the organopolysiloxane units fails to secure wetting with silica and provides the composition with a high thixotropy and less infiltration capability. More than 15 parts of the organopolysiloxane units provides the composition with a high viscosity and less infiltration capability.

In addition to the above-mentioned copolymer, silicone rubber, silicone oil, liquid polybutadiene rubber or a thermoplastic resin such as methyl methacrylate-butadienestyrene copolymer may be blended in the epoxy resin composition for the purpose of stress reduction.

To the epoxy resin composition, a variety of well-known inorganic fillers may be added for the purpose of reducing a coefficient of expansion. Useful inorganic fillers include fused silica, crystalline silica, alumina, boron nitride, aluminum nitride, silicon nitride, magnesia, and magnesium silicate. Inter alia, spherical fused silica is desirable for low viscosity and effective infiltration. In order that the sealing material used as the underfill achieve both an improvement in infiltration and a reduction of linear expansion, a particulate filler having a mean particle diameter of less than about $\frac{1}{10}$ and a maximum particle diameter of less than about $\frac{1}{2}$ of the flip-chip gap width (that is the distance of the substrate-to-chip gap) is preferred. Usually the filler has a maximum particle diameter of up to 50 μm, desirably up to 25 μm, and more desirably up to 10 μm and a mean particle diameter of 0.5 to 10 μm, desirably 0.5 to 5 μm, and more desirably 0.8 to 4 μm. The mean particle size as used herein can be determined, for example, as the weight average (or median diameter) in the particle size distribution as measured by the laser light diffraction method.

The inorganic filler used herein is a mixture of (D) an inorganic filler having a specific surface area of less than 4 $m^2/g$ and preferably at least 0.5 $m^2/g$, more preferably at least 1 $m^2/g$, and (E) a fine inorganic filler having a specific surface area of at least 4 $m^2/g$ and preferably up to 15 $m^2/g$, more preferably up to 8 $m^2/g$. The specific surface area is measured by the BET adsorption method.

In general, spherical silica having a specific surface area of at least 4 $m^2/g$ and hence, a mean particle size of up to 1 μm is precluded from being blended in large amounts in sealing materials of this type because of the problem associated with its too large specific surface area (that is, too small mean particle size) that sealing materials loaded with large amounts of silica become highly viscous. Quite unexpectedly, it has been found that by using a mixture of fine silica surface treated with a specific agent selected from aminosilane and organosilazane compounds and another inorganic filler in a specific mixing ratio, the composition can be given a low viscosity in the low shear region which would otherwise never be achievable in the art, and also improved in thin-film infiltration.

Specifically, a fine inorganic filler having a specific surface area of at least 4 m²/g is surface treated with at least one of aminosilane and organosilazane compounds represented by the following general formulae (2) and (3).

$$(R^1)_3SiN(R^2)_2 \quad (2)$$

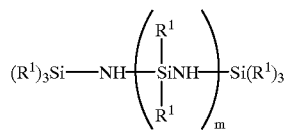

(3)

Herein $R^1$, which may be the same or different, is an alkyl group of 1 to 4 carbon atoms, vinyl group or phenyl group, $R^2$ is hydrogen or as defined for $R^1$, and m is an integer of 0 to 4.

Examples of the aminosilane compound of formula (2) include triorganoaminosilane compounds having an unsubstituted amino group (—NH₂ group) or lower alkyl-substituted amino group (—NHR' group or —NR'₂ group wherein R' is $C_{1-4}$ lower alkyl) such as trimethylsilylamine, triethylsilylamine, vinyldimethylsilylamine, phenyldimethylsilylamine, (N-methylamino) trimethylsilane, (N-ethylamino)trimethylsilane, (N,N-dimethylamino)trimethylsilane, (N,N-diethylamino) trimethylsilane, (N,N-diethylamino)triethylsilane, (N,N-diethylamino)vinyldimethylsilane, and (N,N-diethylamino) phenyldimethylsilane.

Exemplary of the organosilazane compound of formula (3) are silazane oligomers having 2 to 6 silicon atoms including hexaorganodisilazanes such as hexamethyldisilazane, 1,3-divinyltetramethyldisilazane, 1,3-dimethyltetravinyldisilazane, hexavinyldisilazane, and 1,3-diphenyltetramethyldisilazane; octaorganotrisilazanes such as octamethyltrisilazane, 1,5-divinylhexamethyltrisilazane, 1,1,5,5-tetravinyl-tetramethyltrisilazane, and 1,5-diphenylhexamethyltrisilazane; decaorganotetrasilazanes such as decamethyltetrasilazane; and dodecaorganopentasilazanes such as dodecamethylpentasilazane. Of these, hexaorganodisilazanes are preferred.

The reaction of fine spherical silica with an aminosilane and/or organosilazane is well known. Surface treatment may be carried out by spraying 0.5 to 5% by weight of an aminosilane and/or organosilazane over silica, allowing the sprayed silica to stand for 5 to 24 hours in a closed state, and drying the silica for 5 hours at a temperature of 120° C.

The invention uses the fine inorganic filler having a specific surface area of at least 4 m²/g (E) after surface treatment with at least one of aminosilane and organosilazane compounds of formulae (2) and (3) whereas the inorganic filler having a specific surface area of less than 4 m²/g (D) may be surface treated with any of well-known silane coupling agents (e.g., reactive functional group-containing alkoxysilanes) and aminosilanes and organosilazanes as mentioned above, though not essential.

According to the invention, the amount of the inorganic filler having a specific surface area of less than 4 m²/g (D) blended is 50 to 350 parts by weight per 100 parts by weight of the epoxy resin (A) whereas the amount of the surface-treated inorganic filler having a specific surface area of at least 4 m²/g (E) blended is 5 to 120 parts by weight per 100 parts by weight of the epoxy resin (A). The total amount of inorganic fillers (D) and (E) is 100 to 400 parts, especially 150 to 250 parts by weight per 100 parts by weight of components (A), (B) and (C) combined. Preferably, the surface-treated fine inorganic filler (E) accounts for 5 to 35%, and especially 8 to 30% by weight of the inorganic filler mixture (D+E). Smaller total amounts of the fillers (D) and (E) would provide an epoxy resin composition with a greater coefficient of expansion so that cracks may be incurred in a thermal cycling test. An epoxy resin composition with excessive total amounts of the fillers (D) and (E) would be too viscous, restraining its infiltration in thin film form.

In the preferred embodiment of the invention wherein the fine inorganic filler (E) having a specific surface area of at least 4 m²/g and surface treated with at least one of aminosilane and organosilazane compounds of formulae (2) and (3) accounts for 5 to 35% by weight of the entire inorganic fillers (D)+(E), a low viscosity, especially in the low shear region is achievable. Particularly when the preferred inorganic filler mixture is combined with a copolymer resulting from addition reaction between alkenyl groups in an alkenyl group-containing epoxy resin and SiH groups in an organohydrogenpolysiloxane of the formula (1):

$$H_aR_bSiO_{(4-a-b)/2} \quad (1),$$

having 10 to 400 silicon atoms and 1 to 5 SiH groups in a molecule, a lower viscosity, especially in the low shear region is achievable, leading to improved thin-film infiltration. These advantages are obtained when the total amount of inorganic fillers (D)+(E) is 100 to 400 parts by weight per 100 parts by weight of the epoxy resin (A), curing agent (B) and copolymer (C) combined, and the amount of the organopolysiloxane units in the copolymer (C) blended is 1 to 15 parts by weight per 100 parts by weight of the epoxy resin (A) and curing agent (B) combined. Outside these ranges, the composition has a high viscosity, high thixotropy and insufficient thin-film infiltration capability. Especially when the total amount of inorganic fillers (D)+(E) is more than 200 parts by weight per 100 parts by weight of components (A)+(B)+(C), the amount of the organopolysiloxane units in the copolymer (C) should preferably be at least 2 parts, especially at least 4 parts by weight per 100 parts by weight of components (A)+(B). Outside these ranges, the composition may have a high viscosity, high thixotropy and insufficient thin-film infiltration capability.

In the sealing material according to the invention, various other additives are blended if necessary. Such additives include carbon-functional silanes for improving tackiness, pigments (e.g., carbon black), dyestuffs, antioxidants, and surface treating agents (e.g., γ-glycidoxypropyltrimethoxysilane).

The sealing material in the form of an epoxy resin composition according to the invention can be prepared, for example, by simultaneously or separately agitating, dissolving, mixing and dispersing the epoxy resin, curing agent, curing accelerator, inorganic fillers and copolymer while heating if desired. The device for mixing, agitating and dispersing the ingredients is not critical although an attritor, three-roll mill, ball mill or planetary mixer each equipped with agitating and heating means is generally used. A suitable combination of these devices is also useful.

It is noted that the liquid epoxy resin composition used as the sealing material of the invention should preferably have a viscosity of less than about 10,000 poises at 25° C. A conventional method and conditions may be employed in molding or forming the sealing material. Preferably, a seal is formed by molding and curing the sealing material in a heating oven at 100 to 120° C. for at least ½ hour and post-curing at 150° C. for at least ½ hour. Less than ½ hour of post-curing at 150° C. would fail to achieve satisfactory cured characteristics. Less than ½ hour of primary curing at 100 to 120° C. would allow voids to develop after curing.

Referring to FIG. 1, a flip-chip type semiconductor device according to one embodiment of the invention is illustrated as comprising an organic substrate 1 having a wiring pattern-bearing surface (upper surface in the figure). A semiconductor chip 3 is mounted on the wiring pattern-bearing surface via a plurality of bumps 2 to define gaps between the substrate 1 and the semiconductor chip 3 and also between the bumps 2. The gaps are filled with an underfill material 4 and sealed along sides thereof with a fillet material 5. The sealing material of the invention is advantageous especially in forming the underfill material.

When the sealing material of the invention is used as an underfill material, its cured product should preferably have a coefficient of thermal expansion (CTE) of 20 to 40 ppm/° C. at temperatures below its glass transition temperature (Tg). Any of well-known sealing materials may be used as the fillet material although a liquid epoxy resin composition similar to the above-mentioned one may also be used. When a liquid epoxy resin composition is used the fillet material, its cured product should preferably have a CTE of 10 to 20 ppm/° C. at temperatures below its Tg.

EXAMPLE

Examples of the invention are given below by way of illustration and not by way of limitation.

Examples 1–6 and Comparative Examples 1–4

Ten epoxy resin compositions were prepared by uniformly milling the components shown in Tables 1 and 2 in a three-roll mill. It is noted that Fillers A to G are uniform mixtures of silica fines mixed in the proportion shown in Table 3. The following tests were carried out on these epoxy resin compositions. The results are also shown in Tables 1 and 2.

Viscosity

Using a BH type rotating viscometer, a viscosity at 25° C. was measured at 2 rpm and 10 rpm.

Thixotropy

Using a BH type rotating viscometer, a viscosity at 25° C. was measured at 2 rpm and 10 rpm. Thixotropy is the viscosity at 2 rpm divided by the viscosity at 10 rpm.

Gelling time

The time passed until the composition gelled on a hot plate at 150° C. was measured.

Glass transition temperature (Tg)

Using a thermomechanical analyzer (TMA), glass transition was observed while heating a cured sample of 5 mm ×5 mm×15 mm at a rate of 5° C./min.

CTE-1: a coefficient of thermal expansion at temperatures below Tg.

CTE-2: a coefficient of thermal expansion at temperatures above Tg.

In the above measurement of Tg, CTE-1 was determined in the temperature range of 50 to 80° C. and CTE-2 was determined in the temperature range of 200 to 230° C.

Figure 2A:
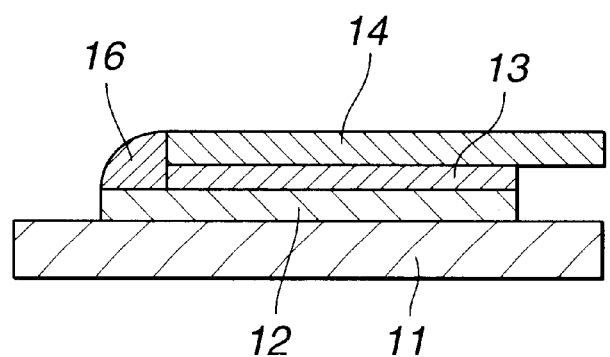
FIG. 2 illustrates a test piece used in an infiltration test, FIG. 2A being a side view and FIG. 2B being a plan view.
Figure 2B:
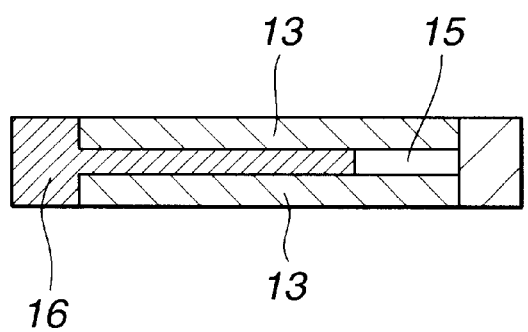

Infiltration test As shown in FIGS. 2A and 2B, a lower slide glass plate 12 was rested on a hot plate 11. A pair of 80-micron polyimide films 13 and 13 laterally spaced 1 cm from each other were set on the glass plate 12. An upper slide glass plate 14 was rested thereon. The slide glass plates 12, 14 defined with the two polyimide films 13, 13 an elongated space 15 having a width of 1 cm and a height of 80 μm. A mass of epoxy resin composition 16 was placed on the lower slide glass plate 12 at one end of the space 15. With this setting, the hot plate 11 was heated at 80° C. or 120° C. whereupon the epoxy resin composition 16 infiltrated through the space 15. The infiltration time was measured until the composition 16 infiltrated and reached a distance of 20 mm from the one end of the space 15.

TABLE 1

|  | E1 | E2 | E3 | E4 | E5 | E6 |
|---|---|---|---|---|---|---|
| RE310 | 45 |  |  |  |  |  |
| RE304 | 50 | 55 | 100 | 100 | 100 | 100 |
| MH700 |  | 40 |  |  |  |  |
| Copolymer | 5 | 5 | 3 | 8 | 6 | 5 |
| Filler A | 200 |  |  |  |  |  |
| Filler B |  | 200 |  |  |  |  |
| Filler C |  |  | 150 |  | 250 |  |
| Filler D |  |  |  | 150 |  |  |
| Filler E |  |  |  |  |  |  |
| Filler F |  |  |  |  |  |  |
| Filler G |  |  |  |  |  |  |
| Filler H |  |  |  |  |  | 150 |
| KBM403 | 0.3 | 0.3 | 0.3 | 0.3 | 0.3 | 0.3 |
| 2PHZ-PW | 3 |  | 3 | 3 | 3 | 3 |
| HX3741 |  | 2 |  |  |  |  |
| Viscosity (poise) @ 25° C./10 rpm | 2100 | 120 | 900 | 1100 | 2600 | 1000 |
| Viscosity (poise) @25° C./2 rpm | 2120 | 121 | 910 | 1120 | 2550 | 1000 |
| Thixotropy | 1.01 | 1.01 | 1.01 | 1.02 | 0.98 | 1.00 |
| Gelling time (sec/150° C.) | 230 | 78 | 220 | 260 | 250 | 250 |
| Tg (° C.) | 138 | 140 | 130 | 134 | 132 | 135 |
| CTE-1 (ppm/° C.) | 25 | 24 | 32 | 31 | 20 | 32 |
| CTE-2 (ppm/° C.) | 77 | 78 | 84 | 85 | 68 | 83 |
| Infiltration time (sec/80° C.) | — | 90 | — | — | — | — |
| Infiltration time (sec/120° C.) | 200 | — | 95 | 85 | 190 | 85 |

TABLE 2

|  | CE1 | CE2 | CE3 | CE4 |
|---|---|---|---|---|
| RE310 | 45 | 45 |  |  |
| RE304 | 50 | 50 | 55 | 100 |
| MH700 |  |  | 40 |  |
| Copolymer | 1 | 5 | 5 | 4 |
| Filler A | 20 |  |  |  |
| Filler B |  |  |  |  |
| Filler C |  |  |  |  |
| Filler D |  |  |  |  |
| Filler E |  | 150 |  |  |
| Filler F |  |  | 150 |  |
| Filler G |  |  |  | 200 |
| KBM403 | 0.3 | 0.3 | 0.3 | 0.3 |
| 2PHZ-PW | 3 | 3 |  | 3 |
| HX3741 |  |  | 2 |  |
| Viscosity (poise) @ 25° C./10 rpm | 1900 | 1300 | 160 | 3400 |
| Viscosity (poise) @ 25° C./2 rpm | 2280 | 1590 | 180 | 4350 |
| Thixotropy | 1.20 | 1.22 | 1.13. | 1.28 |
| Gelling time (sec/150° C.) | 250 | 280 | 75 | 260 |
| Tg (° C.) | 135 | 134 | 145 | 130 |
| CTE-1 (ppm/° C.) | 26 | 30 | 30 | 24 |
| CTE-2 (ppm/° C.) | 78 | 75 | 81 | 76 |
| Infiltration time (sec/80° C.) | — | — | 240 | — |
| Infiltration time (sec/120° C.) | short of 20 mm | 550 | — | short of 20 mm |

Note
RE310: bisphenol A type epoxy resin by Nippon Kayaku K.K.

RE304: bisphenol F type epoxy resin by Nippon Kayaku K.K.

MH700: methyltetrahydrophthalic acid anhydride by Shin-Nippon Rika K.K.

Copolymer: the addition reaction product of the following compounds (dimethylpolysiloxane units in the copolymer: about 81% by weight).

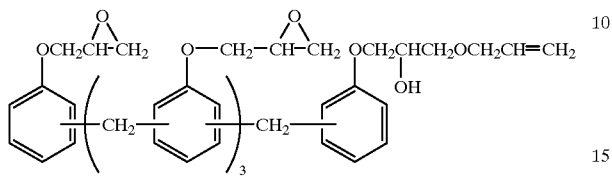

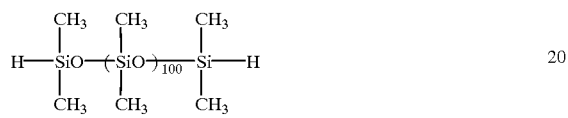

KBM403: silane coupling agent, γ-glycidoxypropyltrimethoxysilane by Shin-Etsu Chemical Co., Ltd.

2PHZ-PW: 2-phenyl-4,5-dihydroxymethylimidazole by Shikoku Chemicals K.K.

HX3741: microcapsulated catalyst containing an imidazole compound by Asahi-Ciba K.K.

TABLE 3

| | Mean particle size (μm) | Maximum particle size (μm) | Specific surface area (m²/g) | Filler A | Filler B | Filler C | Filler D | Filler E | Filler F | Filler G | Filler H |
|---|---|---|---|---|---|---|---|---|---|---|---|
| KBM403-treated SE8FC | 6 | 24 | 2 | 70 | | 80 | | 60 | | 70 | 70 |
| Untreated SO32H | 2 | 10 | 2 | | 70 | | 80 | | | | |
| KBM403-treated SO32H | 2 | 10 | 2 | 10 | | | | | 70 | 10 | |
| Hexamethylsilazane treated SO25R | 0.5 | 10 | 7 | 20 | 30 | 20 | 20 | 40 | | | |
| KBM403-treated SO25R | 0.5 | 10 | 7 | | | | | | 30 | 20 | |
| Trimetylsilylamine treated SO25R | 0.5 | 10 | 7 | | | | | | | | 30 |

SE8FC: spherical silica having a mean particle size of 6 μm by Tatsumori K. K.

SO32H: true spherical silica having a mean particle size of 2 μm by Adomatex K. K.

SO25R: true spherical silica having a mean particle size of 0.5 μm by Adomatex K. K.

There has been described a flip-chip type semiconductor device sealing material which maintains a low enough viscosity in the low shear region to ensure an improved thin-film infiltration capability even when filled with a large amount of inorganic filler. The flip-chip type semiconductor device sealed therewith remains highly reliable.

Japanese Patent Application No. 11-160671 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A sealing material for filling a gap between flip-chip type semiconductor devices comprising
   (A) 100 parts by weight of a liquid epoxy resin,
   (B) 0 to 80 parts by weight of a curing agent per 100 parts by weight of component (A),
   (C) a copolymer obtained through addition reaction between an epoxy resin having alkenyl groups and an organopolysiloxane represented by the following average compositional formula (1):

$$H_a R_b SiO_{(4-a-b)/2} \qquad (1)$$

wherein R is a substituted or unsubstituted monovalent hydrocarbon group, a is a positive number of 0.005 to 0.2, b is a positive number of 1.8 to 2.2, and the sum of a and b is from 1.805 to 2.3, the addition reaction taking place between alkenyl groups in the epoxy resin and hydrogen atoms attached to silicon atoms in the organopolysiloxane, the organopolysiloxane units in the copolymer being 1 to 15 parts by weight per 100 parts by weight of components (A) and (B) combined,
   (D) 50 to 350 parts by weight of an inorganic filler having a specific surface area of less than 4 m²/g, and
   (E) 5 to 120 parts by weight of a fine inorganic filler having a specific surface area of at least 4 m²/g and surface treated with an aminosilane or organosilazane compound represented by the following general formula (2) or (3):

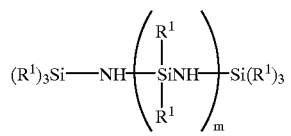

wherein $R^1$ is independently selected from an alkyl group of 1 to 4 carbon atoms, vinyl group and phenyl group, $R^2$ is hydrogen or as defined for $R^1$, and m is an integer of 0 to 4, the total amount of inorganic fillers (D) and (E) being 100 to 400 parts by weight per 100 parts by weight of components (A), (B) and (C) combined.

2. The sealing material of claim 1 wherein the surface-treated fine inorganic filler (E) accounts for 5 to 35% by weight of the inorganic fillers (D) and (E) combined.

3. The sealing material of claim 1 further comprising (F) a curing accelerator.

4. A flip-chip type semiconductor device sealed with the sealing material of claim 1, 2 or 3 in a cured state.

5. The sealing material of claim 1, wherein the epoxy resin of component (A) has at least two epoxy groups per molecule.

6. The sealing material of claim 1, wherein the epoxy resin of component (A) is at least one selected from the group consisting of bisphenol epoxy resin, novolac epoxy resin, naphthalene epoxy resin, biphenyl epoxy resin, and cyclopentadiene epoxy resin.

7. The sealing material of claim 1, wherein the epoxy resin of component (A) has a total chlorine content of up to 1,500 ppm.

8. The sealing material of claim 1, wherein the epoxy resin of component (A) has a total chlorine content of up to 1,000 ppm.

9. The sealing material of claim 1, wherein chlorine has been extracted from the epoxy resin resulting in a chlorine content of up to 10 ppm.

10. The sealing material of claim 1, wherein the curing agent of component (B) is an acid anhydride of about 4 to 25 carbon atoms.

11. The sealing material of claim 10, wherein the curing agent of component (B) has one or two aliphatic or aromatic rings and one or two acid anhydride groups per molecule.

12. The sealing material of claim 10, wherein the concentration of the acid anhydride is 0.3 to 0.7 mol of acid anhydride groups per mol of epoxy groups in the epoxy resin of component (A).

13. The sealing material of claim 1, wherein the curing accelerator of component (F) is at least one selected from the group consisting of an imidazole compound, tertiary amine compound, and organic phosphorus compound.

14. The sealing material of claim 13, wherein the imidazole compound is at least one selected from the group consisting of 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole.

15. The sealing material of claim 13, wherein the tertiary amine compound has an alkyl or aralkyl substituent.

16. The sealing material of claim 13, wherein the organic phosphorus compound is at least one selected from the group consisting of triorganophosphine compounds and quaternary phosphonium salts.

17. The sealing material of claim 1, wherein a is a positive number of 0.01 to 0.1, b is a positive number of 1.9 to 2.0, and the sum of a and b is from 1.91 to 2.1

* * * * *